_United States Patent_ [19]

Okada et al.

[11] 4,127,821

[45] Nov. 28, 1978

[54] CHANNEL SELECTING APPARATUS WITH AUTOMATIC REWRITING OF CHANNEL IDENTIFYING CODES IN A MEMORY

[75] Inventors: Hisao Okada, Yokohama; Takao Mogi, Tokyo, both of Japan

[73] Assignee: Sony Corporation, Tokyo, Japan

[21] Appl. No.: 784,599

[22] Filed: Apr. 4, 1977

[30] Foreign Application Priority Data

Apr. 5, 1976 [JP] Japan .................................. 51-38007

[51] Int. Cl.$^2$ ............................................. H04B 1/06
[52] U.S. Cl. ................................. 325/464; 325/420; 325/470; 358/191
[58] Field of Search ...................... 325/419–423, 325/452, 453, 457, 464, 465, 468, 470, 459; 358/191, 195; 334/14–16

[56] References Cited

U.S. PATENT DOCUMENTS

| | | | |
|---|---|---|---|
| 3,803,494 | 4/1974 | Howell et al. | 325/459 |
| 3,845,394 | 10/1974 | Hamada | 325/464 |
| 3,940,702 | 2/1976 | Yoshimura et al. | 325/464 |
| 3,965,336 | 6/1976 | Grohmann | 325/470 |
| 3,968,440 | 7/1976 | Ehni | 325/464 |
| 3,979,680 | 9/1976 | Sakamoto | 325/464 |
| 3,988,681 | 10/1976 | Schurmann | 325/464 |
| 3,999,131 | 12/1976 | Fukuda et al. | 325/470 |
| 4,004,231 | 1/1977 | Elshuber et al. | 325/464 |

_Primary Examiner_—Robert L. Griffin
_Assistant Examiner_—Jin F. Ng
_Attorney, Agent, or Firm_—Lewis H. Eslinger; Alvin Sinderbrand

[57] ABSTRACT

In a channel selecting apparatus for a television receiver having an electronic tuning tuner for changing the receiving frequency in accordance with an analog control signal applied thereto; a memory is provided with a plurality of addresses at which respective digital codes each intended to identify a respective broadcast channel are selectively stored or written in a programming mode of the apparatus, and, in a channel selecting mode of the apparatus, a selected channel identifying digital code is read out of the memory to a digital-to-analog converter which converts the same into a respective analog control signal for tuning the tuner to a receiving frequency. Any deviation of the receiving frequency, as established in response to the analog control signal, from the transmitting frequency for the channel identified by the digital code then being read out of the memory is detected, and in response thereto the digital code being applied to the digital-to-analog converter is modified or changed in the sense for removing the deviation and thereby effecting a fine tuning operation. When, in the channel selecting mode, the detected deviation of the established receiving frequency from the transmitting frequency exceeds a predetermined amount, the resulting modified digital code may be automatically stored or rewritten in the memory in place of the read out digital code resulting in such deviation. The writing of digital codes in the memory in the programming mode and the rewriting of modified digital codes in the memory in the channel selecting mode are permitted only if, at the time of such writing or rewriting, there is being received a broadcast signal with a transmitted frequency corresponding to the receiving frequency established by the digital code to be written or rewritten in the memory.

11 Claims, 19 Drawing Figures

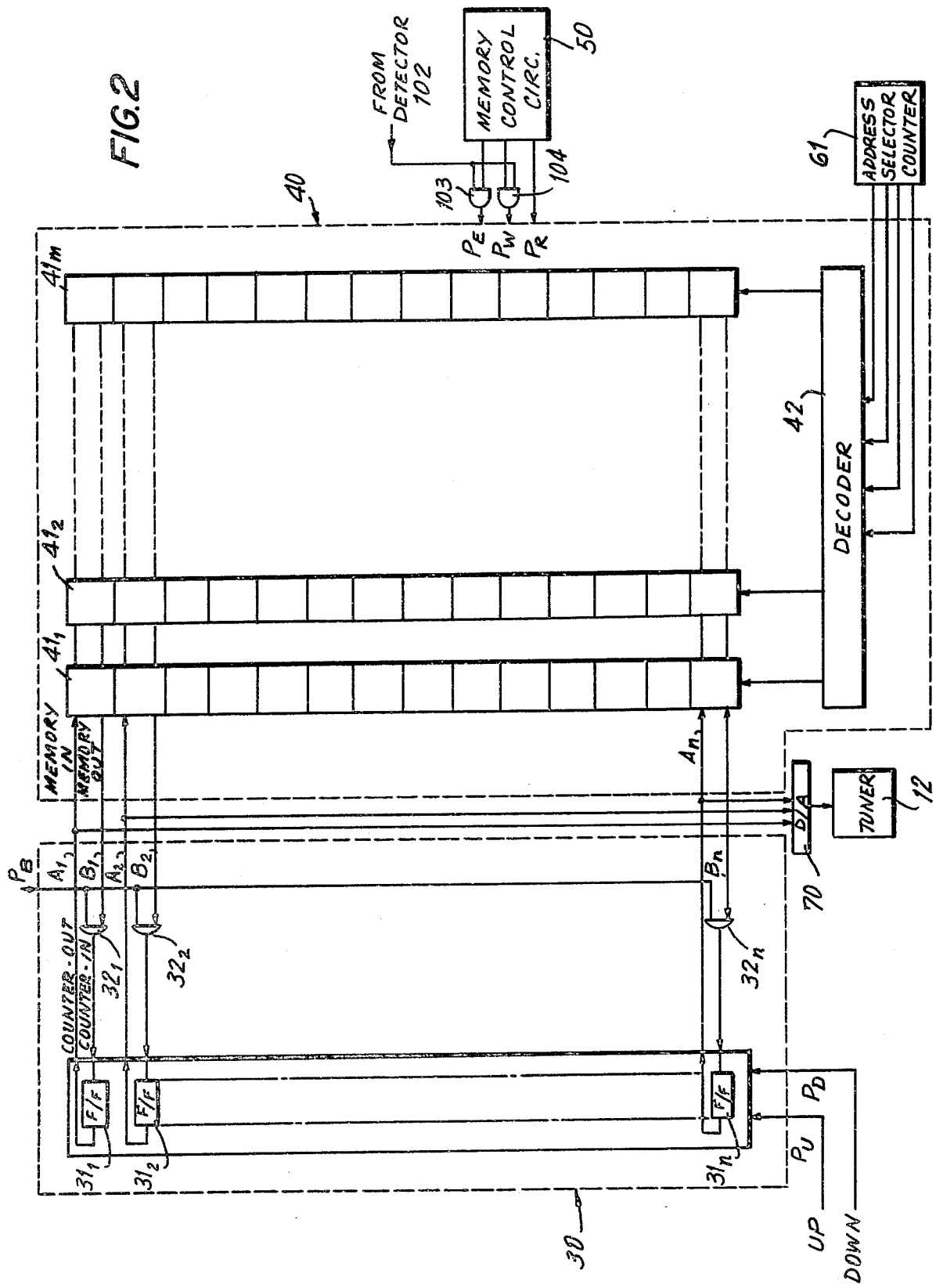

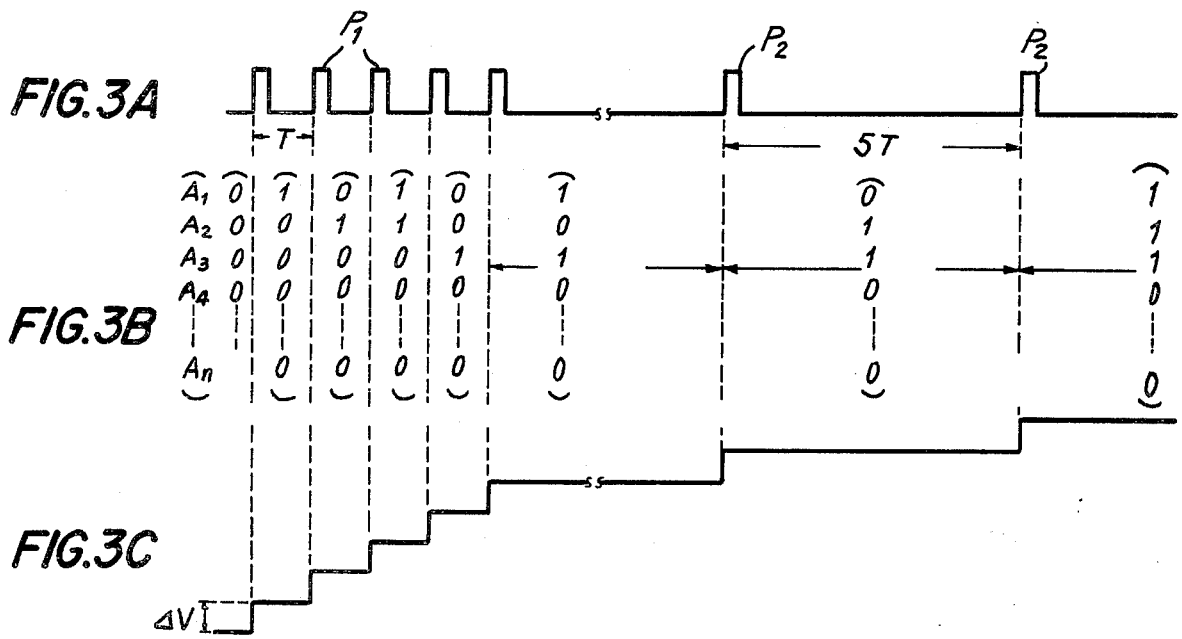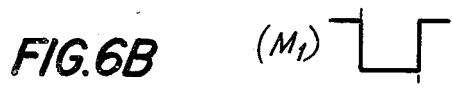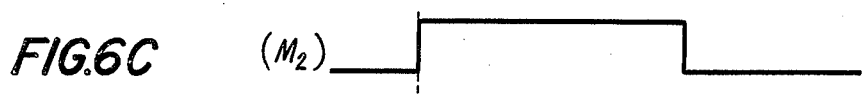

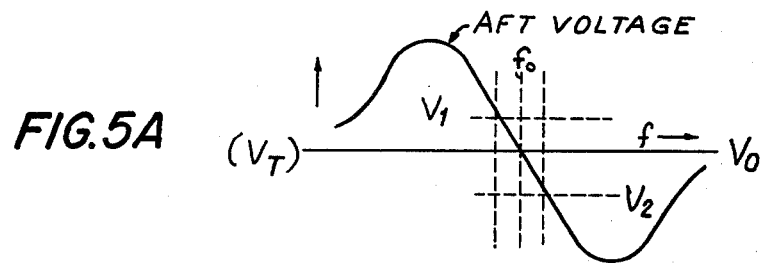
FIG.5A
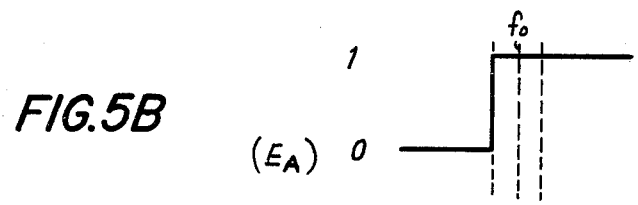
FIG.5B
FIG.5C
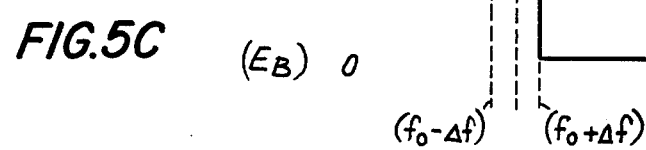
FIG.5D
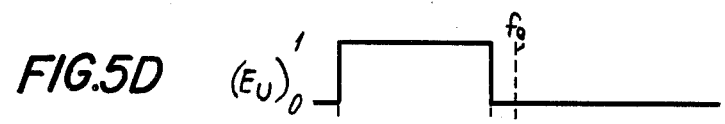
FIG.5E
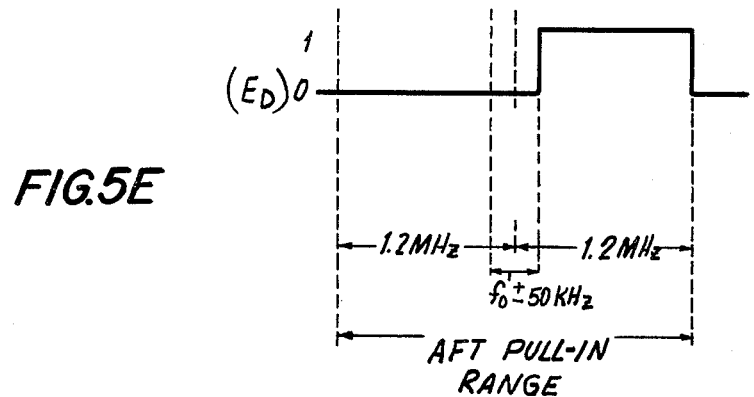

CHANNEL SELECTING APPARATUS WITH AUTOMATIC REWRITING OF CHANNEL IDENTIFYING CODES IN A MEMORY

BACKGROUND OF THE INVENTION

1. Field of the Invention

This invention relates generally to channel selecting apparatus for a television receiver, and more particularly, is directed to a channel selecting apparatus for a television receiver having a so-called electronic tuner.

2. Description of the Prior Art

Most existing television receivers employ electromechanical tuners in which a channel-selecting knob is manually rotatable to various positions established by a detent mechanism and which respectively correspond to the twelve VHF channels. These tuners are susceptible to failure because of, for example, faulty detent mechanisms and poor switch contacts. Furthermore, electro-mechanical tuners of the described type become extremely complex and even more unreliable when designed to tune the UHF channels in addition to the VHF channels.

In order to overcome the above problems of electromechanical tuners, so-called electronic tuners have been proposed for television receivers. In these tuners, a varactor, that is, an analog voltage-controlled, variable reactance device, such as, a variable capacitance diode, is employed as the tuning element, and the control voltage therefor is usually obtained either by means of a potentiometer array or a phase-locked loop arrangement. However, the use of a potentiometer array or a phase-locked loop arrangement for controlling the varactor is also unsatisfactory in respect to the cost and/or reliability of the resulting tuner.

The present inventors have developed a channel selecting apparatus for a television receiver having a tuner with a voltage-controlled variable reactance device as its tuning element and which avoids the above described problems, for example, as disclosed in U.S. Pat. application Ser. No. 716,655, filed Aug. 23, 1976, now U.S. Pat. No. 4,085,371, issued Apr. 18, 1978, and having a common assignee herewith. In such channel selecting apparatus, digital or binary codes representing or identifying respective channels are stored or written at respective addresses in a memory, and a digital-to-analog converter provides an analog control voltage for the variable reactance device in correspondence to each digital code selectively read out of the memory in a channel selecting mode of the apparatus. Further, in a programming mode of the apparatus, the changing digitally coded counts of a counter which is counting sweep pulses are applied to the digital-to-analog converter for similarly controlling the variable reactance device and selected counts of the counter, for example, those which result in the appearance on the receiver screen of pictures or test patterns broadcast by selected television stations or channels, are written at selected addresses in the memory as the channel identifying codes. Furthermore, in such apparatus, deviation of the receiving frequency, as established in response to the analog control voltage, from the correct or transmitted frequency for the channel identified by the digital code then being read out of the memory is detected, and, in response to a detected deivation, the digital code being received by the digital-to-analog converter is modified in the sense for removing said deviation, whereby to effect an automatic fine tuning operation. There is also provided a memory rewriting or refreshing circuit operative, when the detected deviation of the established receiving frequency from the correct or transmitted frequency exceeds a predetermined amount, to store the resulting modified digital code in the memory in place of the read out digital code resulting in said deviation so that the receiving frequency established at any time in response to a channel identifying code read out of the memory will remain within the pull-in range of the automatic fine tuning operation.

However, it is possible in the last-described channel selecting apparatus to effect writing or rewriting of digital codes in the memory even when such digital codes do not correspond to the transmitting frequency of a broadcast channel receivable by the television receiver. Thus, for example, small children when playing with the controls of the television receiver may write or store, at the several addresses of the memory, digital codes that bear no relationship to the frequencies with which television signals are broadcast for the channels receivable at a particular locale. After such erroneous programming or reprogramming of the memory, the reading out of the stored digital code from a selected one of the memory addresses in the channel selecting mode of the apparatus will not tune the receiver to the receiving frequency for a selected channel.

OBJECTS AND SUMMARY OF THE INVENTION

Accordingly, it is an object of this invention to provide an improved channel selecting apparatus for a television receiver having a tuner with a varactor or voltage-control variable reactance device as its tuning element, and in which the above-described problems and disadvantages of the previous proposed channel selecting apparatus are avoided.

More particularly, it is an object of this invention to provide a channel selecting apparatus, as aforesaid, which can be easily and inexpensively formed as an integrated circuit, and which is capable of tuning the associated television receiver to any desired channel with very high accuracy and reliability.

Another object is to provide a channel selecting apparatus, as aforesaid, including a memory adapted to have digital codes representing respective channels stored or written therein in a programming mode of the apparatus, and a digital-to-analog converter which provides an analog control voltage for the variable reactance device in correspondence to each digital code selectively read out of the memory in a channel selecting mode of the apparatus, and in which a selected digital code can be written or stored in the memory only if a broadcast signal with a transmitting frequency substantially corresponding to the receiving frequency established by the tuner in response to that digital code is then being received by the television receiver.

Still another object is to provide a channel selecting apparatus, as aforesaid, with an automatic fine tuning circuit which, in response to a detected deviation of the receiving frequency, as established in response to a digital code applied to the digital-to-analog converter, from the correct or transmitting frequency for the respective channel, is effective to modify the digital code applied to the converter in the sense for removing the detected deviation, and with a memory rewriting or refreshing circuit for rewriting or storing the modified digital code in the memory in place of the read out digital code which resulted in such deviation, and in which such rewriting or refreshing of the memory is permitted only when a broadcast signal with a transmitting frequency substantially corresponding to the receiving frequency established by the tuner in response to the modified digital code is then being received by the television receiver.

In accordance with an aspect of this invention, in a channel selecting apparatus for a television receiver having a tuner with a varactor as its tuning element, and in which digital codes representing or identifying respective channels are stored at respective addresses in a memory, and a digital-to-analog converter provides an analog control voltage for the varactor in correspondence to each digital code selectively read out of the memory in a channel selecting mode of the apparatus, whereas, in a programming mode of the apparatus, changing, digitally coded counts of a counter which is counting sweep pulses are applied to the digital-to-analog converter for similarly controlling the varactor and selected counts of the counter, are to be written at selected addresses in the memory as the channel identifying codes; there is further provided an enabling circuit to permit the writing in the memory of any selected digitally coded count only when such count, as applied to the digital-to-analog converter, causes the tuner to establish a receiving frequency which corresponds substantially to the transmitting frequency of a broadcast signal then being received by the television receiver, for example, as may be detected at the output of the receiver's video IF amplifier.

In accordance with another feature of the invention, in a channel selecting apparatus, as aforesaid, an automatic fine tuning circuit detects a deviation of the receiving frequency, as established by the analog control voltage applied to the tuner, from the correct or transmitted frequency for a selected channel and, in response to such detected deviation, applies correcting pulses to the counter for modifying the digitally coded count of the latter in the sense for removing the deviation, and a memory rewriting or refreshing circuit is operative, in response to a predetermined number of correcting pulses applied to the counter as a result of the fine tuning operation, for rewriting the resulting modified digitally coded count in the memory only if the previously mentioned enabling circuit then permits writing in the memory.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 2 is a block diagram illustrating, in greater detail, an up-down counter for generating channel identifying codes and a memory which are included in the apparatus of FIG. 1;

FIGS. 3A-3C are waveform diagrams to which reference will be made in explaining the operation of the channel selecting apparatus of FIG. 1;

FIGS. 5A-5E are waveform diagrams to which reference will be made in explaining the automatic fine tuning operation of the channel selecting apparatus of FIG. 1; and FIGS. 6A-6H are waveform diagrams to which reference will be made in explaining the operation of a memory rewriting or refreshing circuit included in the apparatus of FIG. 1.

DESCRIPTION OF A PREFERRED EMBODIMENT

Figure 1:
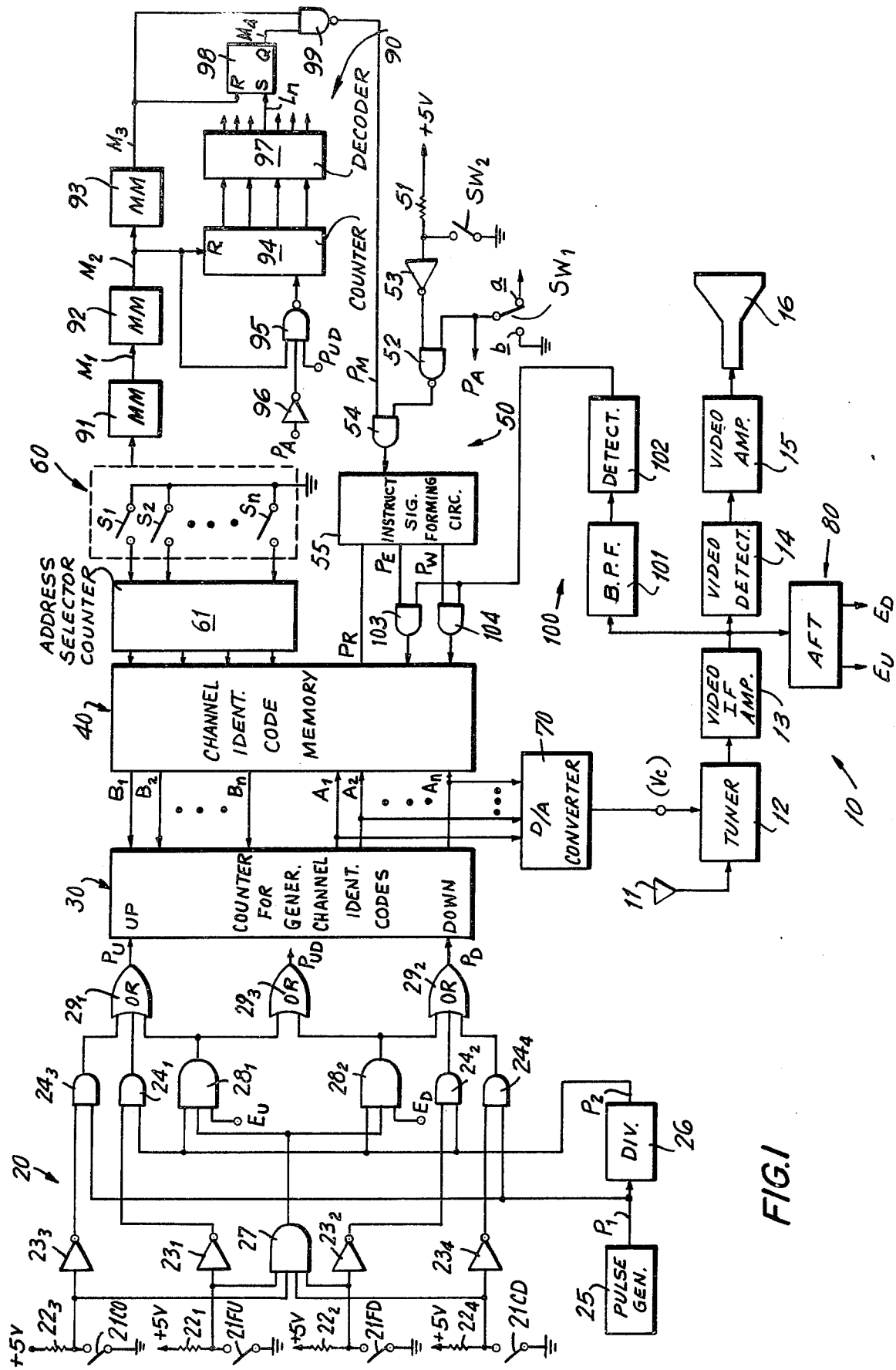
FIG. 1 is a block diagram illustrating a channel selecting apparatus according to an embodiment of this invention.

Referring to the drawings in detail, and initially to FIG. 1 thereof, it will be seen that a channel selecting apparatus according to an embodiment of the present invention, is there illustrated in association with a television receiver 10 which includes an antenna 11, an electronic tuning tuner 12, a video intermediate frequency amplifier 13, a video detector 14 for detecting the IF video signal from amplifier 13, and a video amplifier 15 which amplifies the signal from the detector and supplies it to a television picture tube 16 which provides the television picture in a conventional manner. The tuner 12 includes therein a variable capacitance diode or varactor (not shown) which, as is well known in the art, has its capacitance varied in response to changes in an analog control voltage $V_c$ applied thereto for establishing a receiving frequency corresponding to the level of the control voltage.

The channel selecting apparatus of FIG. 1 is shown to generally comprise a sweep pulse generating circuit 20 which is manually controllable to selectively produce up-sweep pulses $P_U$ or down-sweep pulses $P_D$, and an up-down counter 30 which, in a programming mode of the apparatus, counts the sweep pulses $P_U$ or $P_D$ to establish channel identifying digital codes $A_1, A_2 \ldots A_n$ corresponding to the changing counts of counter 30 and which may be selectively written at selected addresses in a memory 40. Further, the channel selecting apparatus of FIG. 1, generally comprises a memory control circuit 50 for selectively establishing the previously mentioned programming mode of operation or a channel selecting mode of operation in which a channel identifying digital code previously written or stored at a selected address in memory 40 is read out therefrom, as indicated at $B_1, B_2-B_n$, with such read out code being applied to counter 30 for establishing the corresponding count in the latter, and and address selecting circuit 60 that is manually controllable for activating a selected address in memory 40 for either the writing of a selected channel identifying code at such address or the reading out of a previously stored channel identifying code from the selected address during the programming or channel selecting modes, respectively. The channel selecting apparatus shown on FIG. 1 also generally comprises a digital-to-analog converter 70 which provides the analog control voltage $V_c$ for the voractor of a selected band in the electronic tuner 12 in correspondence to the count of counter 30 established by a channel identifying digital code selectively read out of memory 40 in a channel selecting mode of the apparatus, or in correspondence to the changing counts of counter 30 produced when the latter counts sweep pulses from generating circuit 20 in the programming mode of the apparatus.

The output of video intermediate frequency amplifier 13 is also shown to be applied to an automatic fine tuning (AFT) circuit 80 which frequency-discriminates a video carrier wave in the output of IF amplifier 13 and produces a corresponding AFT voltage from which discriminated outputs $E_U$ and $E_D$ are selectively derived, as hereinafter described in detail, so as to indicate that the channel identifying code then being applied to converter 70 for establishing a receiving frequency in the programming or channel selecting mode of the apparatus has to be modified upwardly or downwardly, respectively, for attaining precisely the correct receiving frequency for the respective channel. The discriminated outputs $E_U$ and $E_D$ are applied to sweep pulse generating circuit 20 which, as hereinafter described in detail, responds to the discriminated output $E_U$ or $E_D$ to provide sweep pulses which are counted by counter 30 for modifying the channel identifying code applied therefrom to converter 70 in the direction to obtain precisely the correct receiving frequency, that is, for achieving the desired AFT operation.

Further, in the channel selecting apparatus to which this invention is shown to be applied, a memory rewriting or refreshing circuit 90 is provided and, as hereinafter described in detail, is operative, when the extent to which the channel identifying code being read out of a selected address in memory 40 to counter 30 has to be modified for obtaining the correct receiving frequency for the respective channel exceeds a predetermined amount, to cause the writing of the modified channel identifying code at the selected address in place of the code originally stored thereat. Thus, the memory rewriting circuit 90 is intended to ensure that the channel identifying codes stored in memory 40 will not, with time, result in respective receiving frequencies that are outside the pull-in range of the AFT operation.

In accordance with this invention, the above generally described channel selecting apparatus is provided with an enabling circuit 100 which permits the writing or rewriting in memory 40 of a channel identifying code from counter 30 only when such code, as applied to digital-to-analog converter 70, causes the tuner 12 to establish a receiving frequency which corresponds substantially to the transmitted frequency of a broadcast signal then being received by antenna 11.

In the sweep pulse generating circuit 20 as shown on FIG. 1, a fine up-sweep switch 21FU, a fine down-sweep switch 21FD, a coarse up-sweep switch 21CU and a coarse down-sweep switch 21CD are connected in series circuits with respective resistors $22_1$, $22_2$, $22_3$ and $22_4$, and such series circuits are connected in parallel between a voltage source +5V and ground. The switches 21FU, 21FD, 21CU and 21CD are normally open, as shown, to provide signals at the relatively high level "1" at the junctions of such switches with the respective resistors $22_1$, $22_2$, $22_3$ and $22_4$. Further, the switches 21FU, 21FD, 21CU and 21CD are adapted to be selectively manually displaced to the closed condition thereof for providing a signal at the low level "0" at the junction of the closed switch with the respective resistor $22_1$–$22_4$. Such signals "1" or "0" from switches 21FU, 21FD, 21CU and 21CD are applied through inverters $23_1$, $23_2$, $23_3$ and $23_4$ to first inputs of AND circuits $24_1$, $24_2$, $24_3$ and $24_4$, respectively. Pulses $P_1$ are applied from timing counter or generator 25, as coarse sweep pulses, to second inputs of AND circuits $24_3$ and $24_4$. Further, the pulses $P_1$ from generator 25 are applied to a frequency divider 26 so as to be divided in the latter for providing fine sweep pulses $P_2$ having a period substantially longer than that of the coarse sweep pulses $P_1$, and such fine sweep pulses are applied to second inputs of AND circuits $24_1$ and $24_2$.

The signals "1" or "0" from switches 21FU, 21FD, 21CU and 21CD are also all applied to an AND circuit 27 which has its output connected to AND circuits $28_1$ and $28_2$. The AND circuits $28_1$ and $28_2$ both also have applied thereto the fine sweep pulses $P_2$ from frequency divider 26, and the discriminated outputs $E_U$ and $E_D$ from AFT circuit 80 are applied to AND circuits $28_1$ and $28_2$, respectively. The outputs of AND circuits $24_1$, $24_3$ and $28_1$ are applied to an OR circuit $29_1$ for providing up-sweep pulses $P_U$ to counter 30, while the outputs of AND circuits $24_2$, $24_4$ and $28_2$ are applied to an OR circuit $29_2$ for providing down-sweep pulses $P_D$ to counter 30. Further, the outputs of AND circuits $28_1$ and $28_2$ are connected to an OR circuit $29_3$ for providing pulses $P_{UD}$ to memory rewriting circuit 90 upon an automatic fine tuning operation.

As shown schematically on FIG. 2, the counter 30 may be a conventional n-bit up-down counter having $n$ flip-flops $31_1$, $31_2$–$31_n$ which have their states changes sequentially in the up or down direction when counting the up-sweep pulses $P_U$ or the down-sweep pulses $P_D$, respectively, to establish the respective bits of sequentially changing n-bit channel identifying codes $A_1$, $A_2$–$A_n$. In the programming mode of operation, the channel identifying codes are applied from counter 30 to memory 40 for writing or storage of a selected one of such codes at a selectively activated address in the memory, and the sequentially changing channel identifying codes are also applied from counter 30 to digital-to-analog converter 70 for providing a correspondingly varied control voltage for the varactor in a selected band of electronic tuner 12. The flip-flops $31_1$–$31_n$ of counter 30 are further adapted, in the channel selecting mode of operation, to have their respective states established by the respective bits $B_1$–$B_n$ of a memorized channel identifying code which are read out of a selectively activated address in memory 40 to AND circuits $32_1$–$32_n$ which also receive a load pulse $P_B$ during the channel selecting operation for passing the bits read out of the memory, as hereinafter described in detail, and which have their outputs respectively connected to flip-flops $31_1$–$31_n$.

As also shown on FIG. 2, the memory 40 may be desirably comprised of $m$ memory units $41_1$, $41_2 \ldots 41_m$ at respective addresses in memory 40, with the memory unit at each address being capable of storing n-bits of digital information, that is, the n-bits of a selected channel identifying code from counter 30. Further, the memory 40 is schematically shown to include a decoder 42 which receives a 4-bit digital code from the address selecting circuit 60 which is effective to activate or address the corresponding one of the memory units $41_1$, $41_2 \ldots 41_n$. Preferably, the memory units of memory 40 are composed of non-volatile cells, such as, metal-nitride-oxide-silicon (MSOS) elements, so that the contents thereof, while being electrically alterable, are held unchanged during periods when memory 40 is disconnected from a source of power.

Returning again to FIG. 1, it will be seen that the memory control 50 includes a mode change-over switch $SW_1$ having a movable contact that is manually actuable to selectively engage fixed contacts $a$ and $b$. The fixed contact $a$ is connected to a voltage source +5V so that, when the movable contact of switch $SW_1$ engages fixed contact $a$ to establish the programming mode of operation, a signal $P_A$ at the relatively high level "1" is obtained from switch $SW_1$. On the other hand, the fixed contact $b$ of switch $SW_1$ is connected to ground so that, when the movable contact of switch $SW_1$ is engaged with fixed contact $b$ for establishing the channel selecting mode of operation, the signal $P_A$ is at the relatively low level "0". Memory control 50 is further shown to have a normally open switch $SW_2$ which is connected in series with a resistor 51 between a voltage source +5V and ground. The signal $P_A$ from mode change-over switch $SW_1$ is shown to be applied to one input of a NAND circuit 52 which has its other input connected through an inverter 53 with a junction in the connection between switch $SW_2$ and resistor 51. It will be apparent that, when switch $SW_2$ is in its normally open position, as shown, the output of inverter 53 will be at the low level "0," whereas, when switch $SW_2$ is manually closed to effect a writing operation with the apparatus in its programming mode, the output of inverter 53 will be at the relatively high level "1." The output of NAND circuit 52 is shown to be applied to an AND circuit 54 along with a rewrite instruction signal $P_M$ from circuit 90, and the output of AND circuit 54 is applied to an instruction signal forming circuit 55. When the output of AND circuit 52 or the instruction signal $P_M$ is at the low level "0", the output of AND circuit 54 is "0" and, in response thereto, circuit 55 supplies an erasing pulse $P_E$ and then a writing pulse $P_W$ which are adapted to be applied to the memory unit at a selected address in memory 40 so as to erase the previously stored contents in such memory unit and, thereafter, to write in the selected memory unit the $n$-bit channel identifying code then being received from counter 30. On the other hand, when the output of AND circuit 52 or the instruction signal $P_M$ is at the high level "1", instruction signal forming circuit 55 applies a read pulse $P_R$ to memory 40 so as to effect the read out of the contents stored in the memory unit which is then selected.

The address selecting circuit 60 of the illustrated channel selecting apparatus includes $n$ normally open address selecting switches $S_1, S_2-S_n$ which are each selectively manually actuable to the closed condition for selecting a corresponding one of the $n$ addresses or memory units in memory 40 to be activated during a programming operation or channel selecting operation of the apparatus. The address selecting circuit 60 is further shown to include an address counter 61 which, in response to the closing of a selected one of the switches $S_1-S_n$, produces a corresponding 4-bit addressing code applied to the decoder 42 in memory 40 for addressing the corresponding memory unit in the latter.

Figure 4:
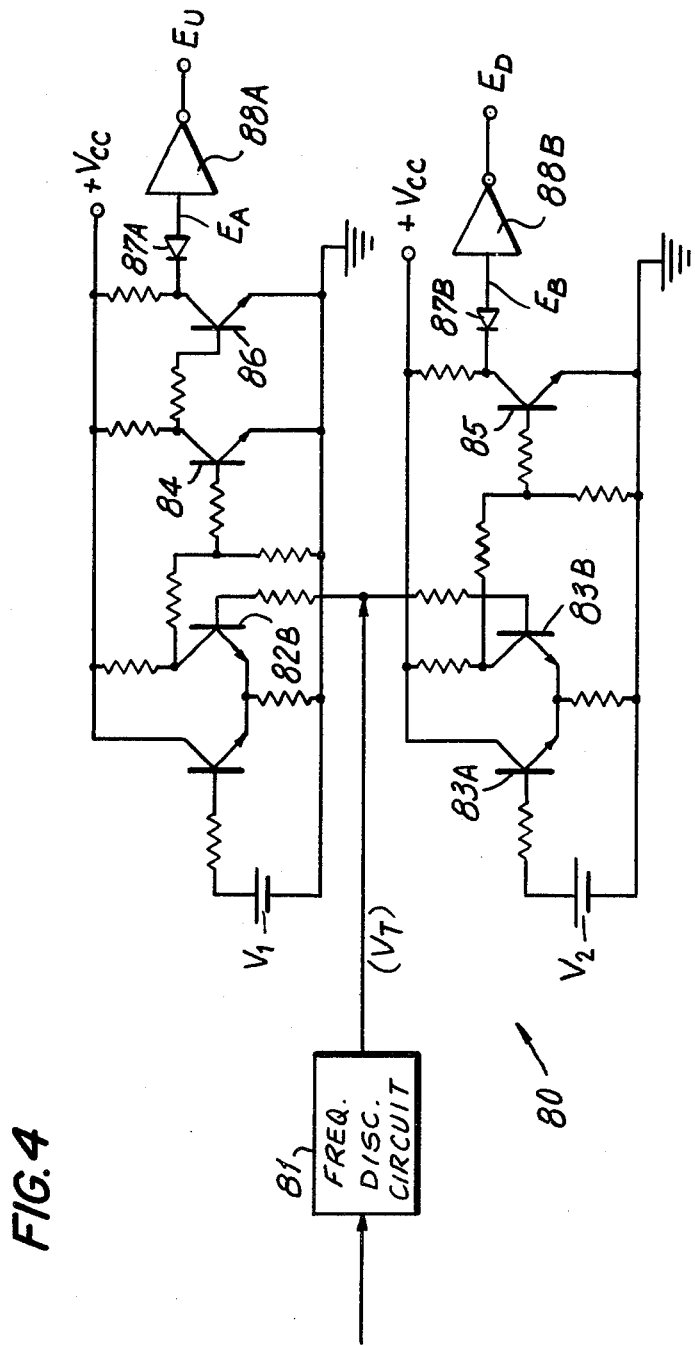
FIG. 4 is a circuit diagram showing a portion of an automatic fine tuning circuit that is included in the apparatus of FIG. 1.

Referring now to FIG. 4, it will be seen that the AFT circuit 80 may comprise a conventional frequency discriminator circuit 81 which is connected to the output of the video IF amplifier 13 and provides an AFT voltage $V_T$. As shown on FIG. 5A, the AFT voltage $V_T$ has a predetermined value $V_o$ when the receiving frequency $f$ established by tuner 12 has the correct value $f_o$, and the AFT voltage $V_T$ varies from the value $V_o$ in accordance with a generally S-shaped curve for values of the established receiving frequency above and below the value $f_o$. The AFT circuit 80 is further shown to comprise transistors 82A and 82B constituting a first differential amplifier, and transistors 83A and 83B constituting a second differential amplifier. Reference voltages $V_1$ and $V_2$ having values to satisfy the inequality of $V_1 > V_o > V_2$ are respectively applied to the base electrodes of transistors 82A and 83A, while the AFT voltage $V_T$ from discriminator circuit 81 is applied to the base electrodes of transistors 82B and 83B. Further, the collector outputs of transistors 82B and 83B are applied to the base electrodes of transistors 84 and 85, respectively, and the collector output of transistor 84 is applied, in turn, to the base electrode of a transistor 86. Finally, the collector output of transistor 86 is coupled through a diode 87A to the input of an inverter 88A to provide a discriminated output $E_A$ at the input of inverter 88A and the discriminated output $E_U$ as the output from inverter 88A. The collector output of transistor 85 is delivered through a diode 87B to provide a discriminated output $E_B$ at the input of inverter 88B and the discriminated output $E_D$ as the output of inverter 88B.

When the AFT voltage $V_T$ is larger than the reference voltage $V_1$, that is, when the established receiving frequency from tuner 12 is less than $(f_o - \Delta f)$, transistors 82A and 82B are respectively non-conductive and conductive. Therefore, transistor 84 is turned OFF so as to turn ON the transistor 86 and, as the result of the foregoing, the discriminated output $E_A$ becomes "0," as shown on FIG. 5B, and the discriminated output $E_U$ becomes "1" as shown in FIG. 5D. On the other hand, transistor 83B is turned ON thereby to make transistor 85 non-conductive, so that the discriminated output $E_B$ becomes "1," as shown on FIG. 5C, and the discriminated output $E_D$ becomes "0," as shown on FIG. 5E. If the receiving frequency established by tuner 12 is in the range between the frequencies $(f_o - \Delta f)$ and $(f_o + \Delta f)$, that is, within the normal tuning range, the AFT voltage from circuit 81 is between $V_1$ and $V_2$ and, therefore, transistor 83B remains ON and the discriminated output $E_D$ continues to be "0." However, with $V_T$ being less than $V_1$, transistor 82B is turned OFF and, as a result, transistor 86 is made non-conductive so that the discriminated output $E_U$ becomes "0." Further, when the AFT voltage $V_T$ from frequency discriminating circuit 81 is less than $V_2$, that is, when the receiving frequency established by tuner 12 is greater than $(f_o = \Delta f)$, the discriminated output $E_U$ remains "0," but transistor 83B is turned OFF so as to make transistor 85 conductive and, as a result thereof, the discriminated output $E_D$ becomes "1."

In a channel selecting apparatus according to this invention, the reference voltages $V_1$ and $V_2$ may be selected, for example, so that the AFT voltage $V_T$ again becomes less than $V_1$ when the established receiving frequency $f$ is less than $f_o - 1.2$ MHz, and so that the AFT voltage $V_T$ again becomes greater than $V_2$ when the established receivinb frequency is greater than $f_o + 1.2$ MHz. Thus, in the example given and as shown on FIG. 5D, the discriminated output $E_U$ is "1" for established receiving frequencies $f$ in the range from $f_o - 1.2$ MHz to $f_o - 50$ KHz, and is otherwise "0;" while the discriminated output $E_D$ is "1" for established receiving frequencies $f$ in the range from $f_o + 50$ KHz to $f_o + 1.2$ MHz, and is otherwise "0," as shown on FIG. 5E.

Reference to FIG. 1 will show that, when discriminated output $E_U$ is "1," upward correction pulses having the period of the fine sweep pulses from frequency divider 26 are applied to counter 30 by way of the circuit constituted by AND circuit 28, and OR circuit $29_1$ so as to increase the digitally coded count $A_1, A_2 \ldots A_n$ of counter 30. On the other hand, when the discriminating output $E_D$ is "1," downward correction pulses also having the period of the fine sweep pulses from frequency divider 26 are applied to counter 30 through the circuit constituted by AND circuit $28_2$ and OR circuit $29_2$ so as to decrease the count of counter 30. It will be seen that, when any one of the switches 21FU, 21FD, 21CU and 21CD is manually closed, the supplying of up-sweep pulses or down-sweep pulses to counter 30 from circuit 20 in response to the closing of such switch is preferential, that is, the resulting "0" level signal applied from the closed one of the switches 21FU, 21FD, 21CU and 21CD to AND circuit 27 causes the output of the latter to be "0" with the result that AND circuits $28_1$ and $28_2$ prevent the passage of any correction pulses therethrough even though the discriminated output $E_U$ or $E_D$ may then be "1".

In the illustrated channel selecting apparatus, the memory rewriting circuit 90 is shown to comprise a monostable multivibrator or detector 91 which is triggered by a falling signal $P_1$ (FIG. 6A) from address selecting circuit 60 whenever any one of the channel selecting switches $S_1 \ldots S_n$ of the latter is closed so as to provide a "0" output $M_1$ (FIG. 6B) from detector 91 for a predetermined time. The rising edge of such "0" output from detector 91 triggers a monostable multivibrator 92 to produce an output $M_2$ (FIG. 6C) which, at its falling edge, triggers a monostable multivibrator 93 to produce an output $M_3$ (FIG. 6D). Further, the rising edge of the output $M_2$ of multivibrator 92 is effective to reset a counter 94. The up- or down-sweep pulses $P_{UD}$ applied by circuit 20 to counter 30 are also applied through OR circuit $29_3$ to a NAND circuit 95 which also has applied thereto the output $M_2$ of monostable multivibrator 92. Further, the signal $P_A$ from mode change-over switch $SW_1$ of memory control circuit 50 is applied through an inverter 96 to NAND circuit 95. Thus, the up- or down-sweep pulses $P_{UD}$ are passed through NAND circuit 95 to be counted by counter 94 only upon the occurrence of the output $M_2$, which indicates that the operation of address selecting circuit 60 for activating one of the memory units or addresses of memory 40 has been completed, and further only when mode change-over switch $SW_1$ engages its fixed contact $b$ for providing the signal or output $P_A$ with the value "0" for establishing the channel selecting mode of operation of the apparatus.

It will be apparent from the above that, after each operation of address selecting circuit 60 with the apparatus in its channel selecting mode so that the channel identifying code stored at the selected address of memory 40 is read out to counter 30 and the latter applies the corresponding binary code $A_1, A_2-A_n$ to digital-to-analog converter 70 for establishing a respective receiving frequency, any operation of AFT circuit 80 for causing circuit 20 to apply upward or downward correcting pulses to counter 30 for modifying the code $A_1, A_2-A_n$ so as to obtain the normal or correct tuned condition also results in such upward or downward correcting pulses being counted by counter 94. In the memory rewriting circuit 90, a decoder 97 is associated with counter 94 and is operative, when counter 94, after being reset by the rising side of pulse or output $M_2$, has counted $n$ upward or downward correcting pulses $P_{UD}$ (FIG. 6E), to provide an output "1" (FIG. 6F) on its output line $L_n$ by which a flip-flop 98 is set to provide an output $M_4$ (FIG. 6G). The flip-flop 98 is reset by the falling side of output $M_3$ from monostable multivibrator 93 so as to terminate the output $M_4$. Finally, the outputs $M_3$ and $M_4$ are applied to a NAND circuit 99 which provides the rewriting instruction $P_M$ having the value "0" (FIG. 6H) during the simultaneous occurrence of outputs $M_3$ and $M_4$. The application of the rewriting instruction $P_M$ to AND circuit 54 in memory control circuit 50 with the apparatus in its channel selecting mode has substantially the same effect as the closing of the writing switch $SW_2$ when the apparatus is in its programming mode. In other words, with the apparatus in its channel selecting mode the application of the rewriting instruction $P_M$ to AND circuit 54 causes instruction signal forming circuit 55 to produce an erasing pulse $P_E$ and then a writing pulse $P_W$ which, if applied to the selected memory unit in memory 40, are effective to erase the channel identifying code previously stored in that memory unit and to write, in place of such channel identifying code, the modified channel identifying code which is then established by counter 30 following the AFT operation. If, for example $n+1$ correction pulses are applied to counter 30 in response to an AFT operation for achieving the normal or correct tuned condition when a channel identifying code is read out of a selected one of the memory units of memory 40, the normal operation of circuit 90 would cause the resulting modified channel identifying code to be rewritten in the same memory unit in place of the original channel identifying code. Of course, if less than $n$ correction pulses are applied to counter 30 in response to an AFT operation, flip-flop 98 is not set and, therefore, the rewriting instruction $P_M$ is not obtained, with the result that the channel identifying code originally written or programmed in the respective memory unit of memory 40 remains unchanged therein.

In any event, the enabling circuit 100 provided in accordance with this invention in the above described channel selecting apparatus permits the erasing and writing pulses $P_E$ and $P_W$ to act on the selected memory unit in memory 40 for either writing or rewriting therein the digital or binary code then produced by counter 30 only if such code, as applied to digital-to-analog converter 70, causes tuner 12 to establish a receiving frequency which corresponds substantially to the transmitted frequency of a broadcast signal then being received by antenna 11. More particularly, the enabling circuit 100 according to this invention may comprise a band pass filter 101 connected to the output of video intermediate frequency amplifier 13 for passing the IF frequency output of the latter, a detector 102 connected to the output of filter 101 for detecting the IF output from amplifier 13 and providing a DC detector output in response thereto, and AND circuits 103 and 104 interposed between instruction signal forming circuit 55 and memory 40. As shown, AND circuits 103 and 104 have first inputs receiving the erasing pulse $P_E$ and the writing pulse $P_W$, respectively, and second inputs receiving the output of detector 102. It will be apparent from the foregoing that the erasing and writing pulses $P_E$ and $P_W$ can be applied to memory 40 through AND circuits 103 and 104 only at such time as detector 102 provides an output for indicating that the receiving frequency established by tuner 12 substantially corresponds to the transmitted frequency of a broadcast signal then being received by antenna 11 for producing an IF output from amplifier 13. Thus, AND circuits 103 and 104 act as gates under the control of the output of detector 102 for determining whether or not pulses $P_E$ and $P_W$ can be applied to memory 40.

The above described channel selecting apparatus according to this invention operates as follows:

PROGRAMMING MODE OF OPERATION

When it is desired to program the channel selecting apparatus, that is, to store at the various addresses in memory 40 channel identifying codes corresponding to various channels that are receivable in the region where the television receiver is located so that, thereafter, such channels can be received or selected merely by actuation of the switches $S_1$-$S_n$ corresponding to the respective addresses, the mode change-over switch $SW_1$ is engaged with its fixed contact $a$ for selecting the programming mode of operation. If it is desired, for example, to store at the address or memory unit $41_1$ of memory 40 a channel identifying code corresponding to the receiving frequency for channel "one" in the Tokyo area of Japan, the address selecting switch $S_1$ is manually closed. Clsoing of switch $S_1$ causes address selecting circuit or counter 61 to provide a 4-bit code which corresponds to the selected address or memory unit $41_1$, and decoder 42 responds to that 4-bit code by activating memory unit $41_1$.

Having selected the address or memory unit of memory 40 at which a channel identifying code is to be programmed and the band or section of tuner 12 which is appropriate for the channel to be programmed at such selected address, the sweep pulse generating circuit 20 is made operative, for example, by manually actuating the coarse up-sweep switch 21CU and holding the latter in its closed position. The closing of switch 21CU causes the associated inverter $23_3$ to provide the output "1" to AND circuit $24_3$. Therefore, at each "1" state of the pulses $P_1$ from timing counter or generator 25, AND circuit $24_3$ provides an output "1" which is applied through OR circuit $29_1$ to counter 30 as an up-sweep pulse $P_U$. Since such pulses $P_1$ have a relatively short period T (FIG. 3A) the pulses $P_U$ appearing while switch 21CU is held in its closed condition may be considered coarse up-sweep pulses which, then being counted by counter 30, cause relatively rapid changes in the count of such counter 30. In other words, when counting the coarse up-sweep pulses $P_U$ from generating circuit 20, the count of counter 40 is changed, in sequence, in the upward direction to similarly change the resulting channel identifying code $A_1,A_2$-$A_n$(FIG. 3B) obtained from counter 30 starting from the state (0000–0), as shown. The changing channel identifying code from counter 30 is applied to digital-to-analog converter 70 in the programming mode of operation. Thus, so long as switch 21CU of sweep pulse generating circuit 20 is held in its closed condition, the channel selecting or analog control voltage from converter 70 is increased progressively, for example, by an increment $\Delta V$ in each period T (FIG. 3C), and hence the receiving frequency established by tuner 12 increases progressively.

When a video picture being broadcast or transmitted by channel "one" appears on the screen of picture tube 16, the coarse up-sweep switch 21CU is released by the operator so as to return to its normal open condition. Upon opening of switch 21CU, the supplying of the coarse up-sweep pulses $P_U$ to counter 30 is terminated so that counter 30 ceases its counting action and the channel identifying code $A_1,A_2$-$A_n$ then obtained from counter 30 determines the approximate value of the receiving frequency of tuner 12 for the desired channel. Thereafter, the fine up-sweep switch 21FU may be manually actuated and held in its closed condition to provide the output "1" from inverter $23_1$ to AND circuit $24_1$ with the result that pulses $P_2$ from divider 26 are passed through AND circuit $24_1$ and OR circuit $29_1$ as fine up-sweep pulses $P_U$ to be counted by counter 30. In counting the fine up-sweep pulses, the counter 30 sequentially changes the resulting channel identifying code $A_1,A_2$-$A_n$ at every period 5T(FIG. 3B), and, accordingly, the channel selecting or control voltage from converter 70 is increased by $\Delta V$ at every period 5T for similarly changing the receiving frequency determined by tuner 12. When viewing of the picture on the screen of picture tube 16 indicates that fine tuning has been achieved in respect to the video signal broadcast on the desired channel, switch 21FU is released to return to its open condition and thereby halt the supplying of the fine up-sweep pulses to counter 30. Of course, in the illustrated embodiment of the invention, after switch 21CU and/or switch 21FU have been selectively closed to bring the receiving frequency established by the code $A_1,A_2$-$A_n$ produced by counter 30 to within the so-called pull-in range of AFT circuit 80, the above described AFT operation may be relied upon to further modify such code for obtaining the normal or correct tuned condition for the channel being programmed.

After the normal or correct tuned condition has been realized, either by selective actuation of switches 21CU and 21FU or switches 21CD and 21FD, or by a combination of actuation of such switches and the AFT operation, the writing switch $SW_2$ is manually closed so that the associated inverter 53 provides the output "1." Since the mode change-over switch $SW_1$ remains engaged with its fixed contact $a$ to provide the output $P_A$ with the value "1," the NAND circuit 52 provides the output "0." As a result of such "0" output from NAND circuit 52, the instruction signal forming circuit 55 supplies an erasing pulse $P_E$ and then a writing pulse $P_W$ to AND circuits 103 and 104, respectively. Since the correct tuned condition has been realized, that is, the receiving frequency established by tuner 12 corresponds to the transmitted frequency of a broadcast signal being received by antenna 11, detector 102 detects the resulting IF output from amplifier 13 and provides a detected output to AND circuits 103 and 104 to permit the erasing and writing pulses $P_E$ and $P_W$ to pass therethrough to memory 40 for erasing any contents previously stored in the memory unit $41_1$ selected by closing of switch $S_1$, and for writing in memory unit $41_1$ the channel identifying code $A_1,A_2$-$A_n$ established by counter 30 for fine-tuning of channel "one."

Following the programming of memory unit $41_1$ with a channel identifying code corresponding to channel "one", the other memory units $41_2$-$41_m$ of memory 40 may be similarly programmed with coded information corresponding to other vhf and/or uhf channels that are receivable in the region where the television receiver is located.

CHANNEL SELECTING MODE OF OPERATION

After the programming of memory 40 has been completed, as described above, the mode change-over switch $SW_1$ is manually actuated to engage its fixed contact $b$ and thereby provide the output $P_A$ with the value "0" for establishing the channel selecting mode of operation for the apparatus. Since writing switch $SW_2$ remains in its open position, the output of the associated inverter 53 is "0" and, accordingly, NAND circuit 52 provides the output "1" to instruction signal forming circuit 55 so that the latter supplies the reading pulse $P_R$ directly to memory 40.

Preferably, when the power source for the channel selecting apparatus is initially turned ON, the address counter 61 of address selecting circuit 60 is reset thereby so that the 4-bit code issuing from counter 61 will activate or address the memory unit $41_1$ in memory 40. In response to the output $P_A$ of mode change-over switch $SW_1$ being "0" for the channel selecting mode of operation, a suitable circuit (not shown) produces the load pulse $P_B$ for a predetermined period. The load pulse $P_B$, when applied to AND circuits $32_1-32_n$ in counter 30, allows the read out to counter 30 from memory unit $41_1$ of the channel identifying code $B_1,B_2-B_n$ previously stored therein and which, in the example described above, represents channel "one" in the Tokyo area. During the existence of load pulse $P_B$, the bits $B_1,B_2-B_n$ of the read out channel identifying code are applied to the respective flip-flops $31_1-21_n$ of counter 30 with the result that such flip-flops assume the states for providing the channel identifying code $A_1,A_2-A_n$ from counter 30 to digital-to-analog converter 70 which, during programming, was determined to correspond to a control voltage for tuner 12 suitable for fine tuning of the receiving frequency to that of channel "one". Therefore, upon the initial supplying of power to the channel selecting apparatus, the latter tunes the television receiver for the reception of the channel which has been programmed into the first address or memory unit $41_1$ of memory 40.

Thereafter, if it is desired to receive a channel programmed in a memory unit of memory 40 other than the first address or memory unit $41_1$, for example, if it is desired to receive channel "three" which has been programmed in the second memory unit $41_2$, the switch $S_2$ of the address selecting circuit 60 is manually closed and, as previously described in connection with the programming mode of operation, the address counter 61 provides the 4-bit code which addresses the second memory unit $41_2$. When the code from addresss counter 61 addresses the memory unit corresponding to closed switch $S_2$, a load pulse $P_B$ is again produced and, in response thereto, the channel identifying code being read out of memory unit $41_2$ correspondingly changes the states of the flip-flops of the counter 30 so that the latter provides the corresponding channel identifying code $A_1,A_2---A_n$ to digital-to-analog converter 70. Therefore, the analog control voltage from converter 70 to tuner 12 is determined to cause the latter to establish the receiving frequency for channel "three".

It will be apparent that the channels programmed in the other memory units $41_3-41_n$ may be similarly selectively received merely by manual closing of a respective one of the address selecting switches $S_3-S_n$.

Although memory 40 is initially programmed with channel identifying codes $A_1,A_2-A_n$ which, when selectively applied to digital-to-analog converter 70, provide control voltages to the varactor of tuner 12 for obtaining the receiving frequency or normal tuned condition for the respective channels, with time, a shift from such normal tuned condition may occur due to temperature drift, annual variation or the like in the electronic tuning tuner 12. In other words, at some time after the programming of a memory unit in memory 40 with a channel identifying code, the control voltage for tuner 12 that results from the application of the programmed code to digital-to-analog converter 70 in the channel selecting mode of the apparatus may no longer produce the receiving frequency for the normal tuned condition of the respective channel. In that event, AFT circuit 80 provides a discriminated output $E_U$ or $E_D$ to cause circuit 20 to apply upward or downward correcting pulses to counter 30 for modifying the channel identifying code $A_1,A_2-A_n$ applied from counter 30 to converter 70 until the normal tuned condition is restored, as previously described.

When the AFT operation does occur with the apparatus in its channel selecting mode, the upward or downward correction pulses $P_{UD}$ applied to counter 30 for modifying the code $A_1,A_2-A_n$ applied from the latter to digital-to-analog converter 70 so as to obtain the normal tuned condition, are also counted by counter 94. When the number of such upward or downward correction pulses reaches $n$, that is, when the receiving frequency resulting from the channel identifying code stored in the selected memory unit of memroy 40 is more than 50 KHz greater than or less than the local oscillation frequency for the normal or correct tuned condition, but still within the pull-in range of the AFT circuit, the memory rewriting circuit 90 provides the rewriting instruction $P_M$. As previously described, such rewriting instruction normally causes the modified channel identifying code $A_1,A_2-A_n$ then produced by counter 30 to be written in the selected memory unit in place of the channel identifying code previouusly written therein.

By reason of the above described rewriting operation, if the tuner 12 undergoes a progressive change in its control voltage-receiving frequency characteristic due to temperature drift, annual variation or the like, upon each periodic selection of each memory unit for selection of the respective channel, the AFT operation provides the normal or correct tuned condition and, if at any time such AFT operation approaches the limits of its pull-in range, the code stored in the memory unit is replaced by a new code corresponding to the changed control voltage-receiving frequency characteristic of the tuner for ensuring that the pull-in range of the AFT circuit is not exceeded.

It is important to note that, in the channel selecting mode of the apparatus according to this invention, the occurrence of the rewriting instruction $P_M$ can cause the modified channel identifying code then produced by counter 30 to be rewritten in the selected memory unit in place of the channel identifying code previously stored therein only if AND circuits 103 and 104 of enabling circuit 100 are simultaneously receiving a detector output from detector 102 so as to permit the passage therethrough of the erasing and writing instructions $P_E$ and $P_W$ from circuit 55 to memory 40.

Of course, when the channel identifying code $A_1,A_2---A_n$ being applied by counter 30 to converter 70 is modified by the operation of AFT circuit 80 with the apparatus in its channel selecting mode, the correction pulses $P_{UD}$ counted by counter 94 for eventually causing the rewriting instruction or signal $P_M$ to be produced ensure that the modified channel identifying code, as applied to digital-to-analog converter 70, will cause tuner 12 to provide a receiving frequency which corresponds to the transmitted frequency of a broadcast signal then being received by antenna 11. Thus, when the rewriting instruction or signal $P_M$ is produced as a result of an AFT operation, detector 102 of enabling circuit 100 produces an output to AND circuits 103 and 104 and the enabling circuit 100 does not interfere with the rewriting of the AFT modified channel identifying code in the selected unit of memory 40 in place of the code previously stored therein.

However, if a child or other person is playing with, or idly manipulating the television receiver controls with the apparatus in its channel selecting mode and, in so doing, activates one of the switches 21CU, 21FU, 21CD or 21FD so as to effect a haphazard change in the code $A_1, A_2–A_n$ provided by counter 30 at a time when memory rewriting circuit 90 has been conditioned to provide the rewriting instruction or signal $P_M$, such haphazardly changed code applied by counter 30 to converter 70 will cause tuner 12 to establish a receiving frequency that does not correspond to the transmitted frequency of a broadcast signal then being received by antenna 11. Therefore, detector 102 will not detect an output from video IF amplifier 13 and, accordingly, AND circuits 103 and 104 will block the passage of the erasing and writing instructions $P_E$ and $P_W$, respectively, to memory 40 so that the haphazardly changed code cannot be rewritten in the memory in place of a correct channel identifying code previously stored therein.

Similarly, with the apparatus in its programming mode, the idle actuation of switches 21CU, 21FU, 21CD and 21FD to cause the generation by counter 30 of a haphazard code that does not correspond to a receivable broadcast signal followed by the actuation of writing switch $SW_2$ cannot cause the writing of such haphazard code in a unit of memory 40. In other words, if the haphazard code produced by counter 30 at the time of closing of switch $SW_1$ with the apparatus in its programming mode does not cause tuner 12 to provide a receiving frequency corresponding to the transmitted frequency of a broadcast signal then being received by antenna 11, detector 102 does not detect an output from video IF amplifier 13 and, accordingly, AND circuits 103 and 104 block the passage to memory 40 of the erasing and writing instructions or pulses $P_E$ and $P_W$.

It will be apparent from the above that the enabling circuit 100 provided in the channel selecting apparatus in accordance with this invention ensures that the channel identifying codes written or rewritten in memory 40 will correspond to receivable broadcast channels, and cannot be replaced by haphazard or irrelevant codes as a result of careless manipulation of the controls.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A channel selecting apparatus for a television receiver having an electronic tuning tuner for determining a receiving frequency in accordance with an analog control signal applied thereto: said channel selecting apparatus comprising pulse generating means for generating sweep pulses; counting means for counting said sweep pulses and providing changing digital codes in correspondence with the changing count of said counting means; memory means having a plurality of addresses for storing respective digital codes each identifying a respective channel; addressing means actuable for selectively activating each of said addresses in the memory means; digital-to-analog converting means for converting each digital code provided by said counting means into a respective analog control signal for said tuner; memory control means selectively disposable in a programming mode and a channel selecting mode, said memory control means, when in said channel selecting mode, adopting the count of said counting means to a channel identifying digital code read out from the address in said memory means which is then activated by said addressing means; write control means operable, when said memory control means is in said programming mode, to cause writing at an address in said memory means then activated by said addressing means of the digital code then being received from said counting means; means for detecting deviation of the receiving frequency, as established in response to said analog control signal, from the transmitted frequency of the broadcast signal then being received; automatic fine tuning means responsive to a detected deviation of said established receiving frequency from said correct receiving frequency for modifying the digital code provided by said counting means to said digital-to-analog converting means in the sense for removing said deviation; rewriting means operative in said channel selecting mode when said deviation exceeds a predetermined amount, to rewrite the resulting modified digital code in said memory means in place of the read out digital code resulting in said deviation; and enabling means which permits said rewriting of the modified digital code in place of said read out digital code only when the receiving frequency determined by said tuner in response to said modified digital code causes said reception by the television receiver of a corresponding broadcast signal.

2. A channel selecting apparatus according to claim 1; in which said automatic fine tuning means includes means for causing said pulse generating means to produce correction pulses counted by said counting means for changing the count of the latter and thereby modifying said digital code provided to said digital-to-analog converting means.

3. A channel selecting apparatus according to claim 1; in which said rewriting means includes second counting means for counting said correction pulses applied to the first mentioned counting means, and means for providing a rewrite instruction signal to said memory control means when the correction pulses counted by said second counting means exceed a predetermined number.

4. A channel selecting apparatus according to claim 3; in which said memory control means further includes instruction signal forming means normally providing a read instruction signal to said memory means in said channel selecting mode and further providing an erase instruction signal and then a write instruction signal in response to said rewrite instruction signal in said channel selecting mode and also in response to operation of said write control means in said programming mode; and in which said enabling means includes gate means interposed between said instruction signal forming means and said memory means for normally blocking the application of said erase and write instruction signals to said memory means, and detecting means for detecting the reception of a broadcast signal by the television receiver and, in response thereto, opening said gate means.

5. A channel selecting apparatus according to claim 4; in which the television receiver further has an antenna for picking-up broadcast signals, and a video intermediate frequency amplifier connected with said tuner to provide an intermediate frequency output when the receiving frequency determined by said tuner in response to the analog control signal applied thereto substantially corresponds to the transmitted frequency of a broadcast signal then picked-up by said antenna; and in which said detecting means detects the output from said video intermediate frequency amplifier.

6. A channel selecting apparatus according to claim 1; in which said automatic fine tuning means includes means for producing first and second discriminated outputs when said established receiving frequency is above and below, respectively, said transmitted frequency of the received broadcast signal by a predetermined amount, and means for causing said pulse generating means to produce said correction pulses to be counted down and up, respectively, by said counting means in response to said first and second discriminated outputs, respectively.

7. A channel selecting apparatus according to claim 1; in which said pulse generating means includes selectively actuable switch means for causing the production of sweep pulses to be counted up by said counting means and the production of sweep pulses to be counted down by said counting means, respectively.

8. A channel selecting apparatus according to claim 7; in which said pulse generating means further includes selectively actuable switch means for causing said sweep pulses to be generated with a relatively short period and with a relatively long period, respectively, so that said counting means effects relatively fast and slow changes in said digital codes when counting said sweep pulses with said relatively short and long periods, respectively.

9. A channel selecting apparatus according to claim 8; further comprising means to prevent the application of said correction pulses to said counting means upon actuation of said switch means.

10. A channel selecting apparatus according to claim 1; in which said memory control means includes instruction signal forming means operative for providing an erase instruction signal and then a write instruction signal for said memory means; and in which said enabling means includes gate means interposed between said instruction signal forming means and said memory means for normally blocking the application of said erase and write instruction signals to said memory means, and detecting means for detecting the reception of a broadcast signal by the television receiver and, in response thereto, opening said gate means.

11. A channel selecting apparatus according to claim 10; in which the television receiver further has an antenna for picking-up broadcast signals, and a video intermediate frequency amplifier connected with said tuner to provide an intermediate frequency output when the receiving frequency determined by said tuner in response to the analog control signal applied thereto substantially corresponds to the transmitted frequency of a broadcast signal then picked-up by said antenna; and in which said detecting means detects the output from said video intermediate frequency amplifier.

* * * * *